United States Patent
Heo et al.

(10) Patent No.: US 9,059,648 B2
(45) Date of Patent: Jun. 16, 2015

(54) DRIVING CIRCUIT, DRIVING MODULE AND MOTOR DRIVING APPARATUS

(71) Applicant: SAMSUNG ELECTRO-MECHANICS CO., LTD., Suwon, Gyunggi-do (KR)

(72) Inventors: Chang Jae Heo, Gyunggi-do (KR); Sung Man Pang, Gyunggi-do (KR)

(73) Assignee: Samsung Electro-Mechanics Co., Ltd., Suwon, Gyunggi-Do (KR)

( * ) Notice: Subject to any disclaimer, the term of this patent is extended or adjusted under 35 U.S.C. 154(b) by 114 days.

(21) Appl. No.: 13/774,664

(22) Filed: Feb. 22, 2013

(65) Prior Publication Data

US 2014/0145658 A1 May 29, 2014

(30) Foreign Application Priority Data

Nov. 26, 2012 (KR) .................. 10-2012-0134748

(51) Int. Cl.
*H02M 3/24* (2006.01)
*H02P 25/08* (2006.01)
*H02P 6/14* (2006.01)
*H02P 27/08* (2006.01)

(52) U.S. Cl.
CPC . *H02P 6/14* (2013.01); *H02P 27/08* (2013.01)

(58) Field of Classification Search
CPC ............... H02P 9/18; H02P 5/06; H03L 7/097
USPC ......... 323/201–204; 318/400.26, 254; 363/98
See application file for complete search history.

(56) References Cited

U.S. PATENT DOCUMENTS

| 4,189,764 | A | * | 2/1980 | Snyder ........................... 363/97 |
| 5,933,341 | A | * | 8/1999 | Kuriyama et al. ............... 363/98 |
| 6,133,767 | A | | 10/2000 | Caesar et al. |
| 7,355,453 | B2 | * | 4/2008 | Watt ............................... 326/87 |
| 7,982,420 | B2 | * | 7/2011 | Kakimoto et al. ........ 318/400.34 |
| 2004/0051578 | A1 | | 3/2004 | Jang et al. |
| 2005/0122072 | A1 | * | 6/2005 | Atmur ........................... 318/254 |

FOREIGN PATENT DOCUMENTS

| JP | 08-228137 A | 9/1996 |
| KR | 20040023936 A | 3/2004 |

* cited by examiner

*Primary Examiner* — Bentsu Ro
*Assistant Examiner* — Zemenay Truneh
(74) *Attorney, Agent, or Firm* — McDermott Will & Emery LLP

(57) ABSTRACT

There are provided a driving circuit, a driving module, a motor driving apparatus capable of adjusting a driving current driving a power semiconductor device, the driving circuit including a driving unit including a plurality of drivers and selecting a corresponding driver among the plurality of drivers according to a selection signal to determine a current level of a driving signal for driving a semiconductor device, a timing controlling unit detecting a phase shift time of the driving signal transferred to the semiconductor device and comparing the detected time with a preset reference time to control the phase shift time of the driving signal, and a driving controlling unit providing the selection signal for selecting a driver to be driven among the plurality of drivers of the driving unit according a control signal from the outside and a timing control signal of the timing controlling unit.

20 Claims, 9 Drawing Sheets

DRIVING CIRCUIT, DRIVING MODULE AND MOTOR DRIVING APPARATUS

CROSS-REFERENCE TO RELATED APPLICATIONS

This application claims the priority of Korean Patent Application No. 10-2012-0134748 filed on Nov. 26, 2012, in the Korean Intellectual Property Office, the disclosure of which is incorporated herein by reference.

BACKGROUND OF THE INVENTION

1. Field of the Invention

The present invention relates to a driving circuit, a driving module, a motor driving apparatus driving a power semiconductor device.

2. Description of the Related Art

In a driving circuit of a general power semiconductor device, in the case in which a self turn-off type power semiconductor device such as an insulated gate bipolar transistor (IGBT), or the like, is used, as disclosed in the following Related Art Document, a gate driving signal for driving the power semiconductor device is provided to a gate of the power semiconductor device. However, rated power required for driving the power semiconductor devices is different for each manufacturer, such that it is difficult to adjust a turn-on and turn-off speed of the power semiconductor device.

RELATED ART DOCUMENT (Patent Document 1) Korean Patent Laid-open Publication No. 10-2004-0023936

SUMMARY OF THE INVENTION

An aspect of the present invention provides a driving circuit, a driving module, a motor driving apparatus capable of adjusting a driving current driving a power semiconductor device.

According to an aspect of the present invention, there is provided a driving circuit including: a driving unit including a plurality of drivers and selecting a corresponding driver among the plurality of drivers according to a selection signal to determine a current level of a driving signal for driving a semiconductor device; a timing controlling unit detecting a phase shift time of the driving signal transferred to the semiconductor device and comparing the detected time with a preset reference time to control the phase shift time of the driving signal; and a driving controlling unit providing the selection signal for selecting a driver to be driven among the plurality of drivers of the driving unit according a control signal from the outside and a timing control signal of the timing controlling unit.

The timing controlling unit may include: a detector detecting the phase shift time of the driving signal transferred to the semiconductor device; a setter setting the reference time; and a comparator comparing the phase shift time detected by the detector with the reference time set by the setter.

The timing controlling unit may detect at least one of a rising time and a falling time of the driving signal.

The detector may detect the at least one of the rising time and the falling time of the driving signal transferred to the semiconductor device, the setter may set at least one of a reference rising time and a reference falling time, and the comparator may compare the at least one of the rising time and the falling time detected by the detector with the at least one of the reference rising time and the reference falling time set by the setter and provides a comparison result.

The driving unit may further include a basic driver operated according to a control signal of the driving controlling unit.

The plurality of drivers may be connected to one another in parallel between a driving power terminal and a ground and respectively include at least two transistors stacked between the driving power terminal and the ground.

The two transistors may be a P-channel metal oxide semiconductor (PMOS) transistor and an N-channel MOS (NMOS) transistor.

The basic driver may include a PMOS transistor and an NMOS transistor stacked between a driving power terminal and a ground.

According to another aspect of the present invention, there is provided a driving module including: at least one driving circuit including a driving unit including a plurality of drivers and selecting a corresponding driver among the plurality of drivers according to a selection signal to determine a current level of a driving signal for driving a semiconductor device, a timing controlling unit detecting at least one of a rising time and a falling time of the driving signal transferred to the semiconductor device, comparing the at least one of the detected rising time and falling time with at least one of a preset reference rising time and a preset reference falling time, and transferring a comparison result to a driving controlling unit, and the driving controlling unit providing the selection signal for selecting a driver to be driven among the plurality of drivers of the driving unit according a control signal from the outside and a timing control signal of the timing controlling unit; and a switch unit including a semiconductor device switched on or off according to the driving signal of the at least one driving circuit.

The switch unit may include at least two semiconductor devices stacked between an operation power terminal and a ground.

The at least one driving circuit may include first and second driving circuits driving the at least two semiconductor devices, respectively.

According to another aspect of the present invention, there is provided a motor driving apparatus including: a driving circuit group including a plurality of driving circuits, each driving circuit including a driving unit including a plurality of drivers and selecting a corresponding driver among the plurality of drivers according to a selection signal to determine a current level of a driving signal for driving a semiconductor device, a timing controlling unit detecting at least one of a rising time and a falling time of the driving signal transferred to the semiconductor device, comparing the at least one of the detected rising time and falling time with at least one of a preset reference rising time and a preset reference falling time, and transferring a comparison result to a driving controlling unit, and the driving controlling unit providing the selection signal for selecting a driver to be driven among the plurality of drivers of the driving unit according a control signal from the outside and a timing control signal of the timing controlling unit; and an inverter including inverter arms, each inverter arm including a semiconductor device switched on/off according to a driving signal from the plurality of driving circuits of the driving circuit group to drive a motor.

The inverter may include three-phase inverter arms respectively having at least two power switching devices stacked therein.

The driving circuit group may include: a plurality of high side driving circuits driving high side power switching devices among the stacked at least two power switching devices of the three-phase inverter arms, respectively; and a plurality of low side driving circuits driving low side power switching devices among the stacked at least two power switching devices of the three-phase inverter arms, respectively.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE EMBODIMENTS

Figure 1:
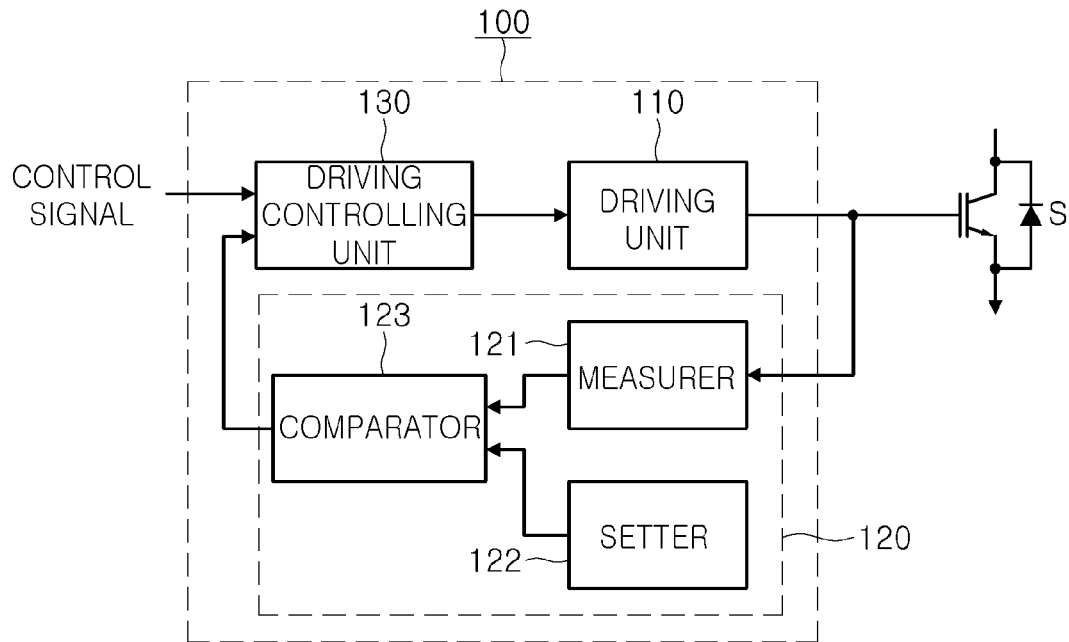
FIG. 1 is a schematic configuration diagram of a driving circuit according to an embodiment of the present invention.

Hereinafter, embodiments of the present invention will be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the shapes and dimensions of elements may be exaggerated for clarity, and the same reference numerals will be used throughout to designate the same or like elements.

FIG. 1 is a schematic configuration diagram of a driving circuit according to an embodiment of the present invention.

Referring to FIG. 1, a driving circuit 100 according to the embodiment of the present invention may include a driving unit 110, a timing controlling unit 120, and a driving controlling unit 130.

The driving unit 110 may include a plurality of drivers (not shown) to adjust a driving current driving a switch S by the driver selected according to a selection signal.

Figure 5:
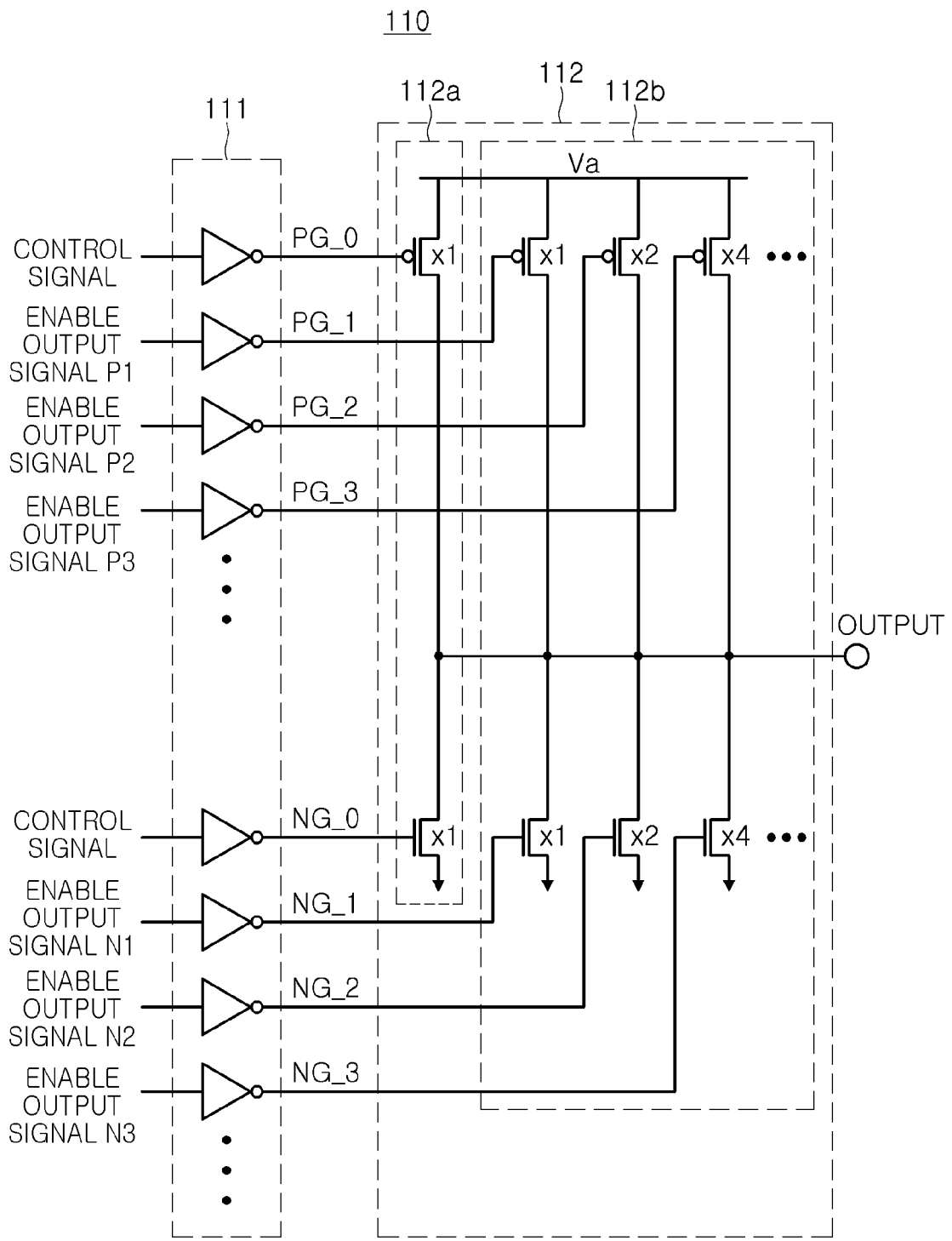
FIG. 5 is a schematic circuit diagram of a driving unit used in the driving circuit according to the embodiment of the present invention.

A detailed description thereof will be provided with reference to FIG. 5.

The timing controlling unit 120 may include a measurer 121, a setter 122, and a comparator 123.

The measurer 121 may measure a phase shift time at which a voltage level of a driving signal transferred to the switch S is shifted, preferably, measure at least one of a rising time at which a voltage level of the driving signal rises from a low level to a high level and a falling time at which the voltage level of the driving signal falls from the high level to the low level, more preferably, both of the rising time and the falling time.

The setter 122 may set a preset reference phase shift time transferred from the driving unit 110 to the switch S, preferably, preset at least one of a reference rising time and a reference falling time of the voltage level of the driving signal, more preferably, preset both of the reference rising time and the reference falling time.

The comparator 123 may compare the phase shift time at which the voltage level of the driving signal measured by the measurer 121 is shifted with the reference phase shift time of the setter 122, preferably, compare at least one of the rising time and the falling time of the voltage level of the driving signal with at least one of the reference rising time and the reference falling time, more preferably, compare the rising time and the falling time of the voltage level of the driving signal with the reference rising time and the reference falling time, respectively. A comparison result of the comparator 123 may be provided to the driving controlling unit 130.

The driving controlling unit 130 may select at least a portion of the plurality of drivers of the driving unit 110 according to a control signal from the outside and the comparison result of the comparator 123 to adjust a current level of the driving signal. Therefore, the rising time and the falling time of the voltage level of the driving signal may be varied. Then, the varied rising time and falling time may be again compared with the rising time and the falling time set by the timing controlling unit 120, and the comparison result may be transferred to the driving controlling unit 130. As a result, the driving signal having the rising time and the falling time set by the timing controlling unit 120 is transferred to the switch S, such that the driving signal having a current level corresponding to a rated current of the switch S may be automatically transferred to the switch S.

Figure 2:
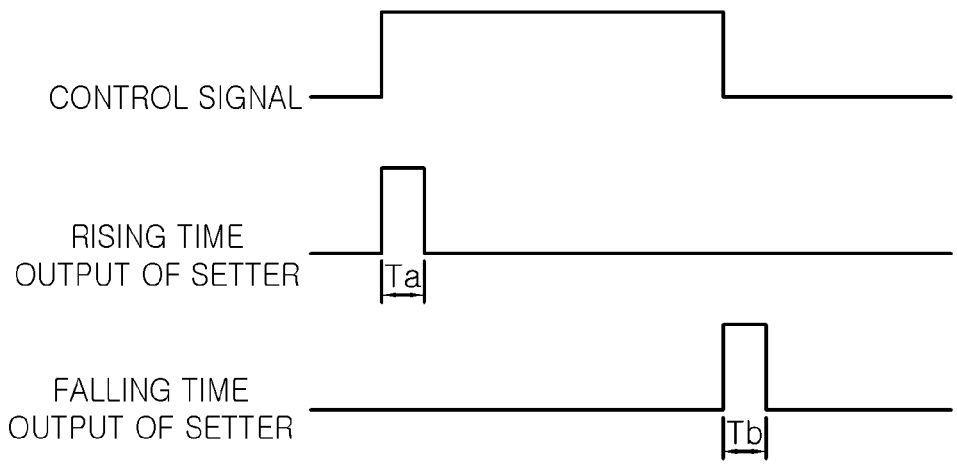
FIGS. 2 through 4 are graphs showing operating waveforms of a timing controlling unit used in the driving circuit according to the embodiment of the present invention.
Figure 3:
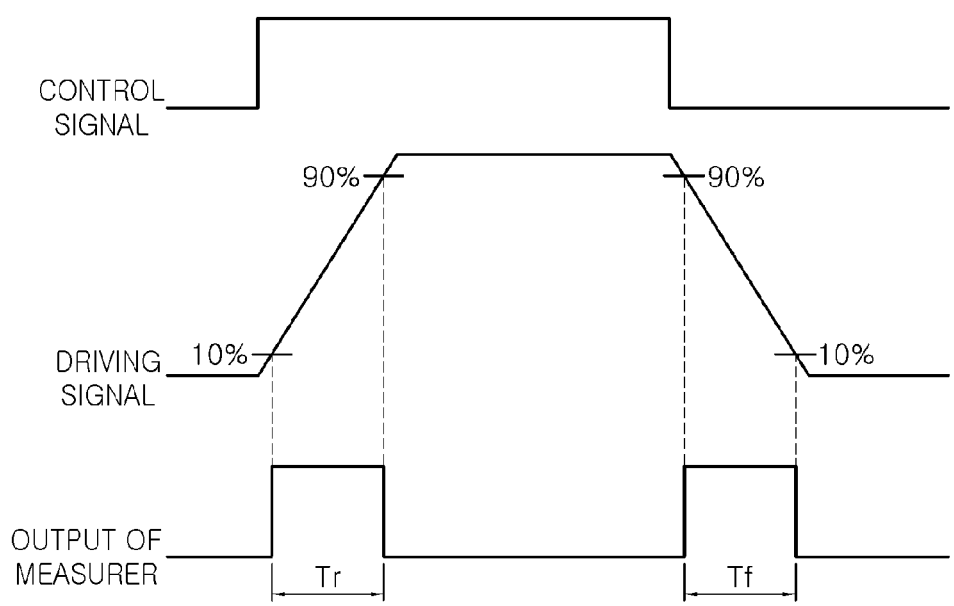
Figure 4:
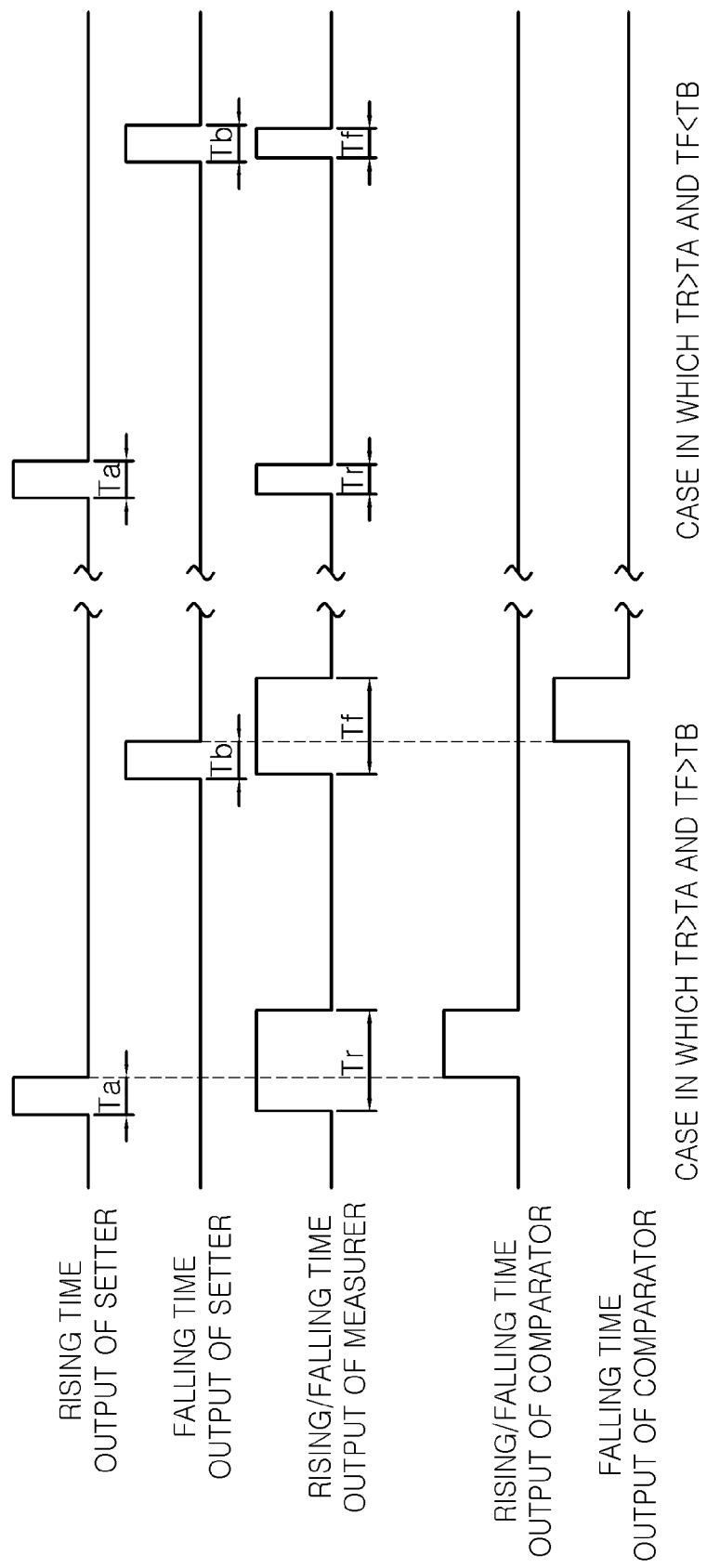

FIGS. 2 through 4 are graphs showing operating waveforms of a timing controlling unit used in the driving circuit according to the embodiment of the present invention.

Referring to FIGS. 2 through 4 together with FIG. 1, as shown in FIG. 2, the setter 122 may set a reference rising time Ta and a reference falling time Tb against the control signal from the outside for switching on the switch S.

As shown in FIG. 3, the measurer 121 may measure a rising time Tr and a falling time Tf of the voltage level of the driving signal against the control signal from the outside. In this case, the measurer 121 may measure a time at which the voltage level of the driving signal rises from 10% to 90% as the rising time Tr and measure a time at which the voltage level of the driving signal falls from 90% to 10% as the falling time Tf.

As shown in FIG. 4, the comparator 123 may compare the reference rising time Ta and the reference falling time Tb of the setter 122 with the rising time Tr and the falling time Tf of the measurer 121, output differences therebetween, and transfer the differences to the driving controlling unit 130.

FIG. 5 is a schematic circuit diagram of a driving unit used in the driving circuit according to the embodiment of the present invention.

Referring to FIG. 5, the driving unit 110 used in the driving circuit 100 according to the embodiment of the present invention may include a transferring unit 111 and a driver group 112.

The transferring unit 111 may transfer the control signal from the driving controlling unit 130 and the selection signal to corresponding drivers, respectively, and the driver group 112 may include a basic driver 112a and a plurality of drivers 112b. Here, the control signal may be transferred to the basic driver 112a, and the selection signal may be transferred to the plurality of drivers 112b to select and drive at least a portion of the plurality of drivers. Therefore, the current level of the driving signal may be adjusted.

The basic driver 112a and the plurality of drivers 112b may respectively include a P-channel metal oxide semiconductor (PMOS) transistor and an N-channel MOS (NMOS) transistor stacked between a driving power terminal to which a driving power Va is input and a ground, respectively.

A basic current level of the driving signal may be formed by the basic driver 112a driven by the control signal, and the plurality of drivers 112b may be selected in the case in which a larger current is required according to the rated current of the switch S, which may be determined according to the comparison result of the comparator 123.

Figure 6:
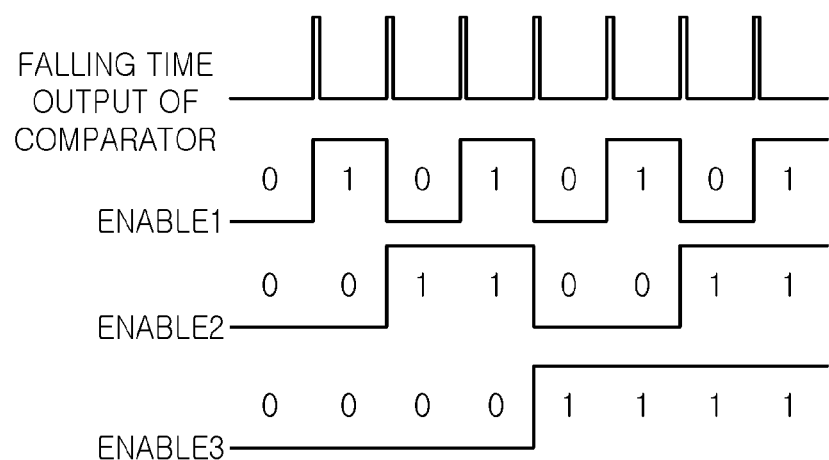
FIGS. 6 and 7 are graphs showing operating waveforms of a driving controlling unit used in the driving circuit according to the embodiment of the present invention.
Figure 7:
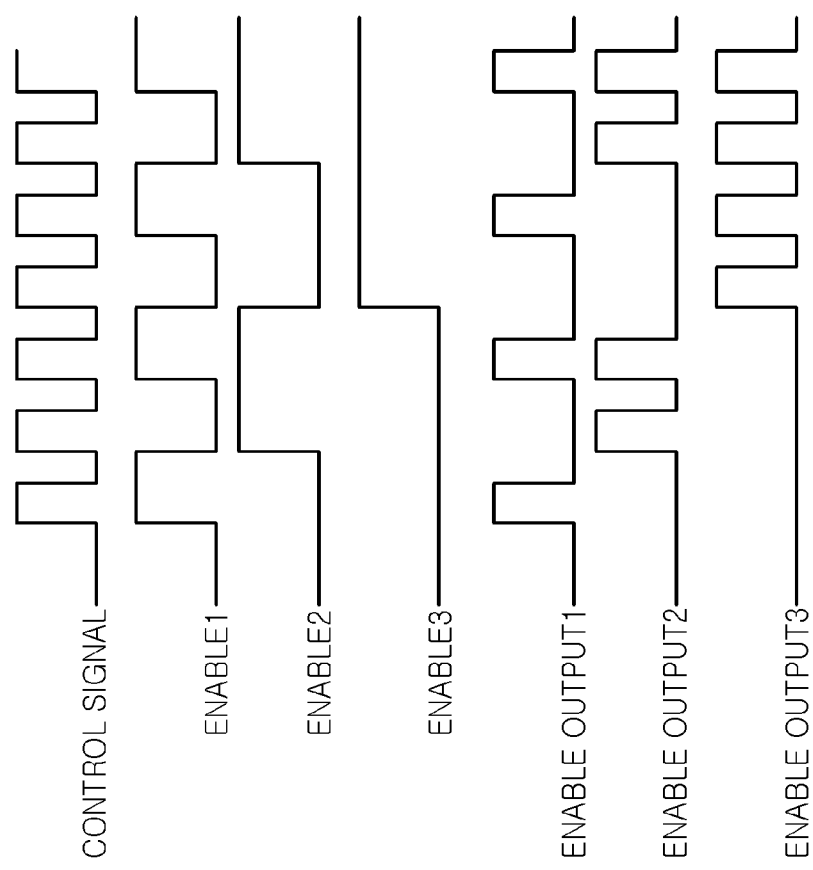

FIGS. 6 and 7 are graphs showing operating waveforms of a driving controlling unit used in the driving circuit according to the embodiment of the present invention.

Referring to FIGS. 6 and 7 together with FIGS. 1 and 5, the selection signal for selecting at least a portion of the plurality of drivers 112b may be output according to the comparison result of the comparator 123. For example, in the case in which the plurality of drivers 112b include first to third drivers, the size or the number of transistors of the second driver is two times larger than those of the first driver and the size or the number of transistors of the third driver is four times larger than those of the first driver, kinds of pulses of the selection signal may be 8, that is, in a range of '000' to '111'.

Figure 8:
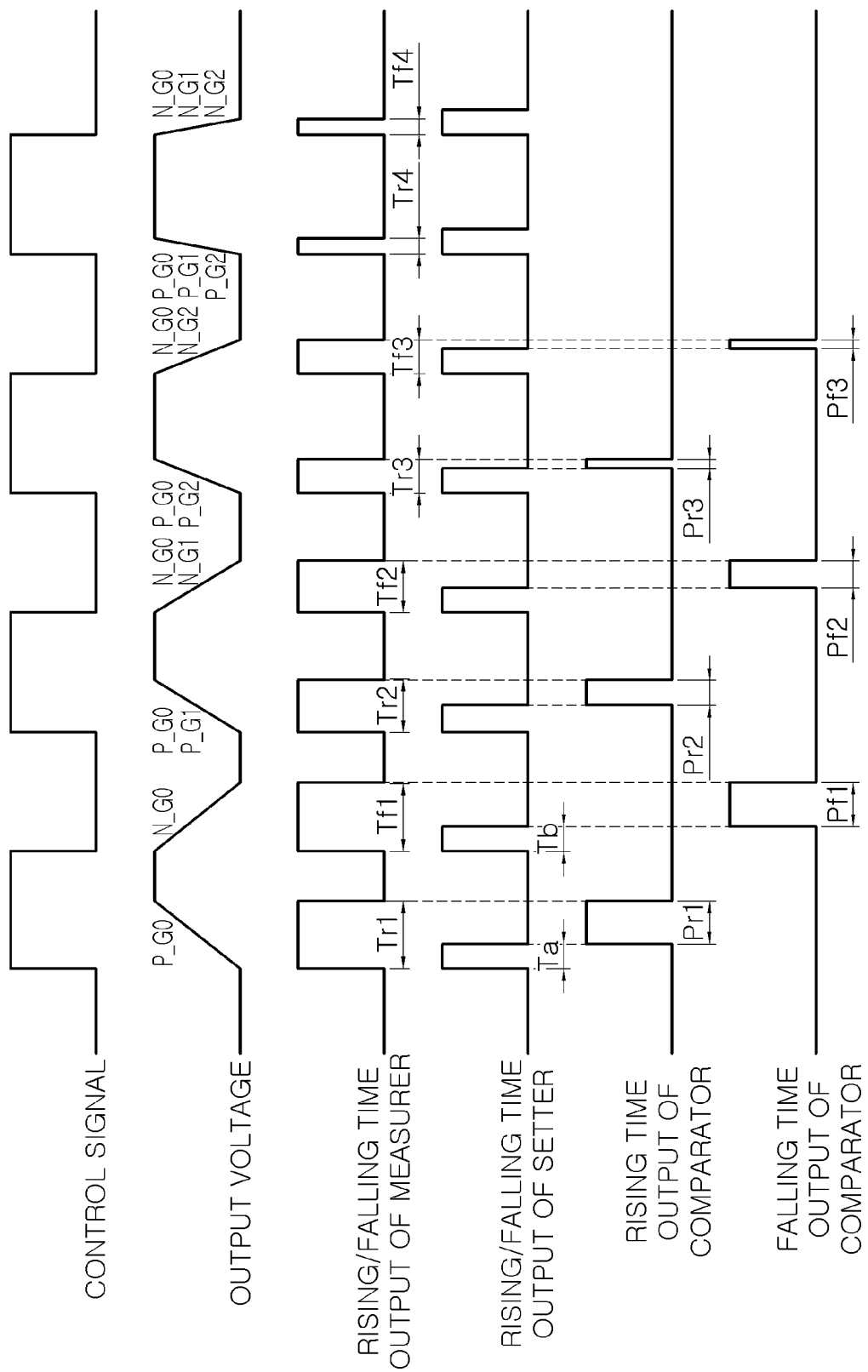
FIG. 8 is a graph showing operating waveforms of main components of the driving circuit according to the embodiment of the present invention.

FIG. 8 is a graph showing operating waveforms of main components of the driving circuit according to the embodiment of the present invention.

The entire operation of the driving circuit 100 according to the embodiment of the present invention will be described with reference to FIG. 8 together with FIGS. 1 and 5. The voltage level of the driving signal may be output according to the control signal, and at least a portion of the plurality of drivers 112b are selected to adjust the current level of the driving signal, such that the rising time and the falling time of the voltage level of the driving signal may be converged on the set reference rising time and reference falling time.

That is, more specifically, the selection signal may include enable output signals P1, P2, and P3 selecting the PMOS transistors of the plurality of respective drivers 112b and enable output signals N1, N2, and N3 selecting the NMOS transistors thereof.

The enable output signals P1, P2, and P3 selecting the PMOS transistors and the enable output signals N1, N2, and N3 selecting the NMOS transistors, and the control signal may be transferred to gates of corresponding transistors through the transferring unit 111, respectively, as gate signals PG_0, PG_1, PG_2, PG_3, NG_0, NG_1, NG_2, and NG_3 selecting the transistors of corresponding drivers of the basic driver 112a and the plurality of drivers 112b, to thereby control turning-on and turning-off of the transistors.

Describing this with reference to the graph of FIG. 8, first, the gate signals PG_0 and NG_0 are transferred to the basic driver by the control signal, such that the PMOS transistor and the NMOS transistor of the basic driver may be driven. Therefore, a rising time Tr1 and a falling time Tf1 of the measurer are compared with the reference rising time Ta and the reference falling time Tb of the setter, respectively, such that comparison results Pr1 and Pf1 of the comparator may be output.

Therefore, since the rising time Tr1 and the falling time Tf1 of the measurer and the reference rising time Ta and the reference falling time Tb of the setter have differences generated therebetween as shown in FIG. 8, the gate signals PG_1 and NG_1 selecting and driving the PMOS transistor and the NMOS transistor of the first driver of the plurality of drivers 112b are transferred together with the gate signals PG_0 and NG_0 to the driving unit 110, such that the corresponding PMOS transistor and NMOS transistor may be driven. Therefore, a rising time Tr2 and a falling time Tf2 of the measurer are compared with the reference rising time Ta and the reference falling time Tb of the setter, respectively, such that comparison results Pr2 and Pf2 of the comparator may be output.

The gate signals PG_2, PG_3, NG_2, and NG_3 driving the PMOS transistors and the NMOS transistors of the second and third drivers, respectively, are transferred to the driving unit 110 until the comparison results between the rising time Tr2 and the falling time Tf2 of the measurer and the reference rising time Ta and the reference falling time Tb of the setter are not output, and rising times Tr3 and Tr4 and falling times Tf3 and Tf4 of the measurer are compared with the reference rising time Ta and the reference falling time Tb of the setter, respectively, such that comparison results Pr3 and Pf3 of the comparator may be output until a signal level of the comparison results of the comparator is reduced to a low level.

Figure 9:
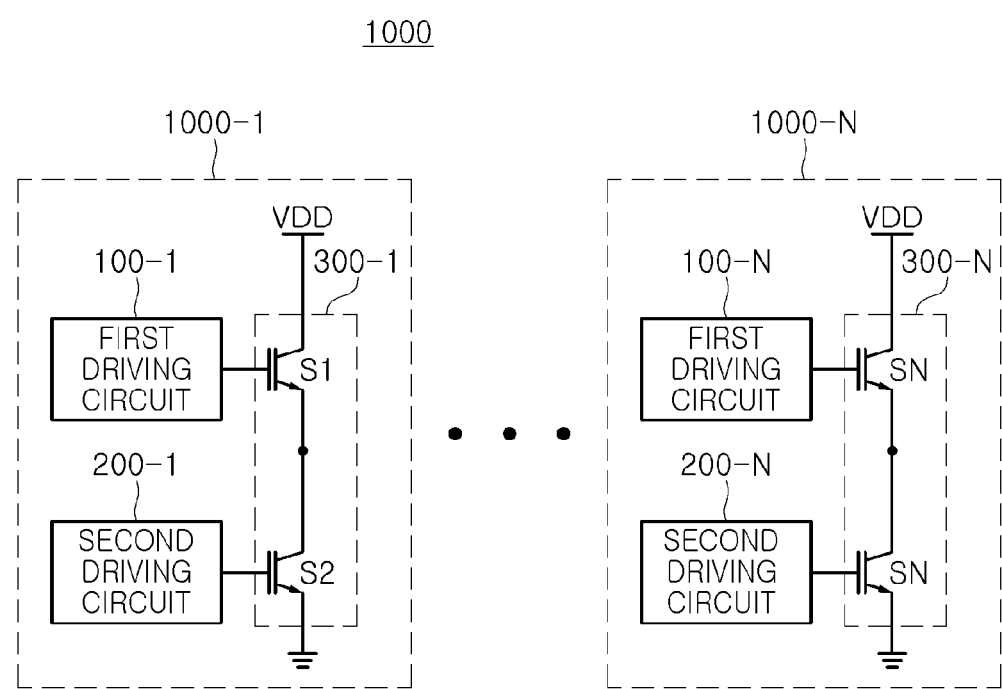
FIG. 9 is a schematic configuration diagram of a driving module according to an embodiment of the present invention.

FIG. 9 is a schematic configuration diagram of a driving module according to an embodiment of the present invention.

The driving circuit according to the embodiment of the present invention shown in FIG. 1 may form the driving module as shown in FIG. 9 together with a switch.

The driving module may include a plurality of unit circuits 1000-1 to 1000-N each including a switch unit 300-1 having at least two transistors S1 and S2 stacked between an operation power terminal supplying an operation power VDD and a ground and first and second driving circuits 100-1 and 200-1 driving the at least two transistors S1 and S2, respectively.

Since the first and second driving circuits 100-1 and 200-1 are similar to the driving circuit described with reference to FIGS. 1 through 8, a detailed description thereof will be omitted.

Figure 10:
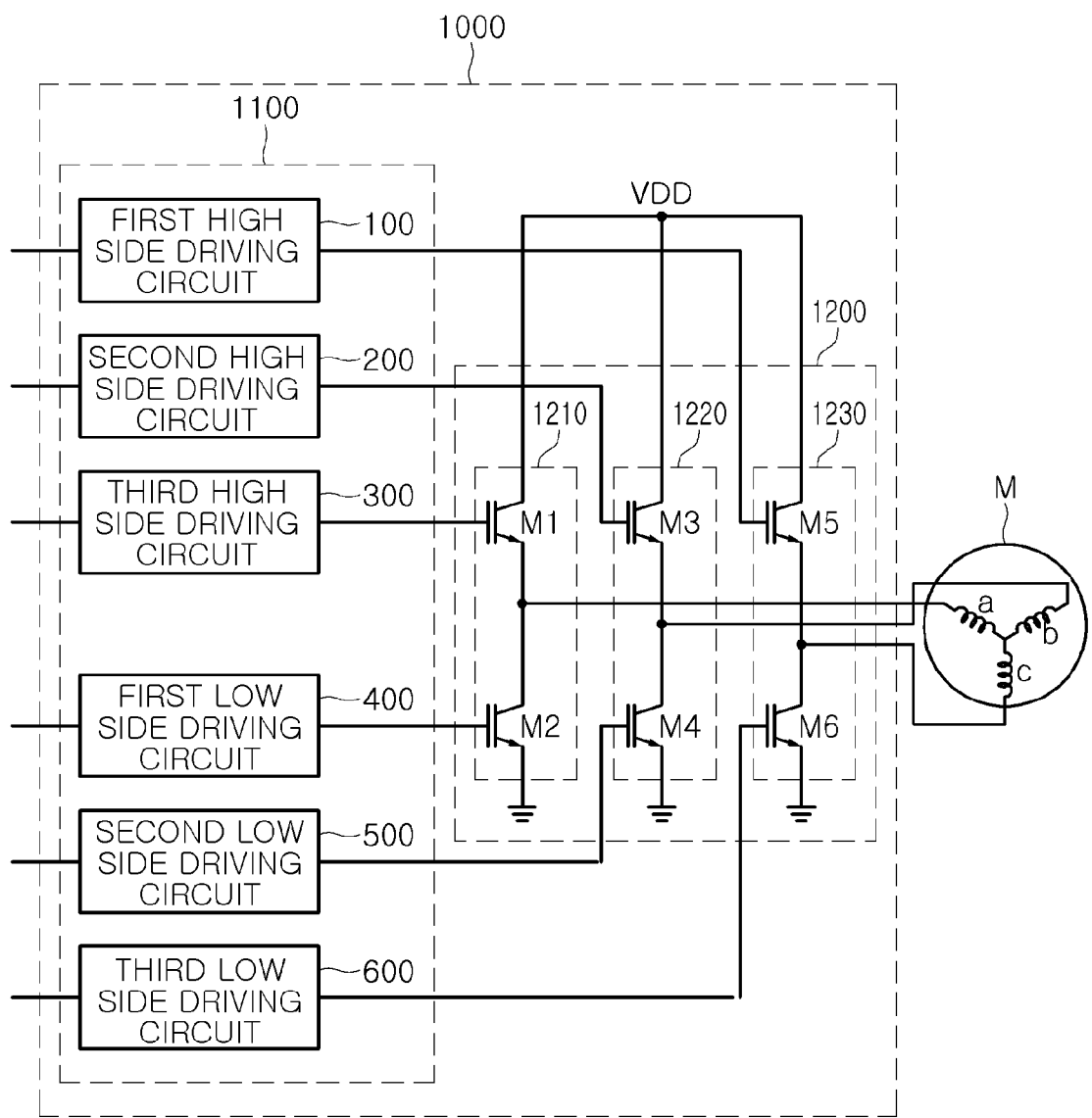
FIG. 10 is a schematic configuration diagram of a motor driving apparatus according to an embodiment of the present invention.

FIG. 10 is a schematic configuration diagram of a motor driving apparatus according to an embodiment of the present invention.

The driving module shown in FIG. 9 may be used in the motor driving apparatus. To this end, the motor driving apparatus may include an inverter 1200 and a driving circuit group 1100 that drive a motor M.

The inverter 1200 and the driving circuit group 1100 may form the driving module. In the case in which the motor M is a three-phase (a, b, and c) motor, the inverter 1200 may include three-phase inverter arms 1210, 1220, and 1230, which may include at least two power switching devices among power switching devices M1, M2, M3, M4, M5, and M6 stacked between the operation power terminal and the ground, respectively. The above-mentioned power switching devices may be transistors having the same polarity, insulated gate bipolar transistors (IGBTs), or the like.

The driving circuit group 1100 may include first to third high side driving circuits 100, 200, and 300 and first to third low side driving circuits 400, 500, and 600, wherein the first to third high side driving circuits 100, 200, and 300 may drive high side transistors M1, M3, and M5 of the first to third inverter arms 1210, 1220, and 1230, respectively, and the first to third low side driving circuits 400, 500, and 600 may drive low side transistors M2, M4, and M6 of the first to third inverter arms 1210, 1220, and 1230, respectively.

Since operations and configurations of the first to third high side driving circuits 100, 200, and 300 and the first to third low side driving circuits 400, 500, and 600 are the same as those of the components shown in FIGS. 1 through 8, a detailed description thereof will be omitted.

As set forth above, according to the embodiments of the present invention, the driving current driving a power semiconductor device is adjusted to adjust turn-on and turn-off speeds of the power semiconductor device, whereby a trade-off between electromagnetic interference and switching loss according to a switching speed of the power semiconductor device may be adjusted.

While the present invention has been shown and described in connection with the embodiments, it will be apparent to those skilled in the art that modifications and variations can be made without departing from the spirit and scope of the invention as defined by the appended claims.

What is claimed is:

1. A driving circuit comprising:
    a driving unit including a plurality of drivers and selecting a corresponding driver among the plurality of drivers according to a selection signal to determine a current level of a driving signal for driving a semiconductor device;
    a timing controlling unit detecting a phase shift time at which a voltage level of the driving signal transferred to the semiconductor device is shifted and comparing the detected time with a preset reference time to control the phase shift time of the driving signal; and
    a driving controlling unit providing the selection signal for selecting a driver to be driven among the plurality of drivers of the driving unit according a control signal from the outside and a timing control signal of the timing controlling unit.

2. The driving circuit of claim 1, wherein the timing controlling unit includes:
    a detector detecting the phase shift time of the driving signal transferred to the semiconductor device;
    a setter setting the preset reference time; and
    a comparator comparing the phase shift time detected by the detector with the preset reference time set by the setter.

3. The driving circuit of claim 2, wherein the timing controlling unit detects at least one of a rising time and a falling time of the driving signal.

4. The driving circuit of claim 3, wherein the detector detects the at least one of the rising time and the falling time of the driving signal transferred to the semiconductor device,
    the setter sets at least one of a reference rising time and a reference falling time, and
    the comparator compares the at least one of the rising time and the falling time detected by the detector with the at least one of the reference rising time and the reference falling time set by the setter and provides a comparison result.

5. The driving circuit of claim 1, wherein the driving unit further includes a basic driver operated according to a control signal of the driving controlling unit.

6. The driving circuit of claim 1, wherein the plurality of drivers are connected to one another in parallel between a driving power terminal and a ground and respectively include at least two transistors stacked between the driving power terminal and the ground.

7. The driving circuit of claim 6, wherein the two transistors are a P-channel metal oxide semiconductor (PMOS) transistor and an N-channel MOS (NMOS) transistor.

8. The driving circuit of claim 5, wherein the basic driver includes a PMOS transistor and an NMOS transistor stacked between a driving power terminal and a ground.

9. A driving module comprising:
    at least one driving circuit including a driving unit including a plurality of drivers and selecting a corresponding driver among the plurality of drivers according to a selection signal to determine a current level of a driving signal for driving a semiconductor device, a timing controlling unit detecting at least one of a rising time at which a voltage level of the driving signal rises and a falling time at which the voltage level of the driving signal falls when transferred to the semiconductor device, comparing the at least one of the detected rising time and falling time with at least one of a preset reference rising time and a preset reference falling time, and transferring a comparison result to a driving controlling unit, and the driving controlling unit providing the selection signal for selecting a driver to be driven among the plurality of drivers of the driving unit according a control signal from the outside and a timing control signal of the timing controlling unit; and
    a switch unit including a semiconductor device switched on or off according to the driving signal of the at least one driving circuit.

10. The driving module of claim 9, wherein the switch unit includes at least two semiconductor devices stacked between an operation power terminal and a ground.

11. The driving module of claim 10, wherein the at least one driving circuit includes first and second driving circuits driving the at least two semiconductor devices, respectively.

12. The driving module of claim 9, wherein the timing controlling unit includes:
    a detector detecting the at least one of the rising time and the falling time of the driving signal transferred to the semiconductor device;
    a setter setting the at least one of the reference rising time and the reference falling time; and
    a comparator comparing the at least one of the detected rising time and falling time with the at least one of the preset reference rising time and reference falling time.

13. The driving module of claim 9, wherein the driving unit further includes a basic driver operated according to a control signal of the driving controlling unit,
    the basic driver including a PMOS transistor and an NMOS transistor stacked between a driving power terminal and a ground.

14. The driving module of claim 9, wherein the plurality of drivers are connected to one another in parallel between a driving power terminal and a ground and respectively include a PMOS transistor and an NMOS transistor stacked between the driving power terminal and the ground.

15. A motor driving apparatus comprising:
    a driving circuit group including a plurality of driving circuits, each driving circuit including a driving unit including a plurality of drivers and selecting a corresponding driver among the plurality of drivers according to a selection signal to determine a current level of a driving signal for driving a semiconductor device, a timing controlling unit detecting at least one of a rising time at which a voltage level of the driving signal rises and a falling time at which the voltage level of the driving signal falls when transferred to the semiconductor device, comparing the at least one of the detected rising time and falling time with at least one of a preset reference rising time and a preset reference falling time, and transferring a comparison result to a driving controlling unit, and the driving controlling unit providing the selection signal for selecting a driver to be driven among the plurality of drivers of the driving unit according a control signal from the outside and a timing control signal of the timing controlling unit; and an inverter including inverter arms, each inverter arm including a semiconductor device switched on/off according to a driving signal from the plurality of driving circuits of the driving circuit group to drive a motor.

16. The motor driving apparatus of claim 15, wherein the inverter includes three-phase inverter arms respectively having at least two power switching devices stacked therein.

17. The motor driving apparatus of claim 16, wherein the driving circuit group includes:
- a plurality of high side driving circuits driving high side power switching devices among the stacked at least two power switching devices of the three-phase inverter arms, respectively; and
- a plurality of low side driving circuits driving low side power switching devices among the stacked at least two power switching devices of the three-phase inverter arms, respectively.

18. The motor driving apparatus of claim 15, wherein the timing controlling unit includes:
- a detector detecting the at least one of the rising time and the falling time of the driving signal transferred to the semiconductor device;
- a setter setting the at least one of the reference rising time and the reference falling time; and
- a comparator comparing the at least one of the detected rising time and falling time with the at least one of the preset reference rising time and reference falling time.

19. The motor driving apparatus of claim 15, wherein the driving unit further includes a basic driver operated according to a control signal of the driving controlling unit,
the basic driver including a PMOS transistor and an NMOS transistor stacked between a driving power terminal and a ground.

20. The motor driving apparatus of claim 15, wherein the plurality of drivers are connected to one another in parallel between a driving power terminal and a ground and respectively include a PMOS transistor and an NMOS transistor stacked between the driving power terminal and the ground.

* * * * *